United States Patent [19]

Mullen

[11] Patent Number: 5,583,445

[45] Date of Patent: Dec. 10, 1996

[54] OPTO-ELECTRONIC MEMBRANE PROBE

[75] Inventor: Ruth A. Mullen, Malibu, Calif.

[73] Assignee: Hughes Aircraft Company, Los Angeles, Calif.

[21] Appl. No.: 191,884

[22] Filed: Feb. 4, 1994

[51] Int. Cl.[6] .................................................. G01R 31/308
[52] U.S. Cl. .......................................... 324/753; 324/754
[58] Field of Search .................................. 356/364, 365, 356/369; 324/158 P, 158 F, 96, 752, 754, 753, 96

[56] References Cited

U.S. PATENT DOCUMENTS

| | | | |
|---|---|---|---|
| 4,603,293 | 7/1986 | Mourou et al. . | |
| 4,681,449 | 7/1987 | Bloom et al. . | |
| 4,851,767 | 7/1989 | Halboot | 324/158 P |
| 4,910,454 | 3/1990 | Williamson . | |
| 5,148,103 | 9/1992 | Pasiecznik, Jr. | 324/758 |
| 5,164,664 | 11/1992 | Soelkner | 324/752 |
| 5,264,787 | 11/1993 | Woith et al. | 324/758 |
| 5,272,434 | 12/1993 | Meyrueix | 324/96 |
| 5,331,275 | 7/1994 | Ozaki | 324/757 |
| 5,357,194 | 10/1994 | Ullman et al. | 324/754 |

FOREIGN PATENT DOCUMENTS 0197196  10/1986  European Pat. Off. .

OTHER PUBLICATIONS

"Analysis of Picosecond Optoelectronic Cross–Correlation Switches", D. J. Moss, et al., Journal of Applied Physics, vol. 54(10), Oct. 1993, pp. 6026–6030.

"A CW 20–Ghz Optoelectronic Source with Phased–Array Applications", D. Butler, Microwave and Optical Technology Letters, vol. 1, No. 4, Jun. 1988, pp. 119–123.

"Optoelectronic Approach to On–Chip Device and Circuit Characterization at Microwave and Millimeter–Wave Frequencies", C. Rauscher, IEEE Transactions on Microwave Theory and Techniques, vol., 39, No. 7, Jul. 1991, pp. 1179–1193.

"Picosecond GaAs–Based Photoconductive Optoelectronic Detectors", F. W. Smith et al., pp. 176–183.

"Electrooptic Sampling in GaAs Integrated Circuits", B. H. Kolner et al., IEEE Journal of Quantum Electronics, vol. QE–22, No. 1, Jan. 1986, pp. 79–93.

"Ultra–High Bandwidth Detachable Optoelectronic Probes", M. Scheuermann et al., OSA Proceedings on Picosecond Electronics and Optoelectronics, Editors Sollner and Bloom, vol. 4, Mar. 8–10, 1989, pp. 22–26.

(List continued on next page.)

*Primary Examiner*—Ernest F. Karlsen
*Assistant Examiner*—Russell M. Kobert
*Attorney, Agent, or Firm*—V. D. Duraiswamy; W. K. Denson-Low

[57] ABSTRACT

A probe for testing very high frequency circuit chips (34) includes a flexible membrane (12) having test probe contacts (14), arranged to contact pads (32) on the device under test to bias up, drive and load down the circuit under test. Various optically-addressable devices (68,130,202) are mounted on the membrane and either excited or probed by a laser beam (66) to transmit and/or sense very high frequency electrical signals to/from the device under test. The optically-addressable devices are excited or probed by a high bandwidth laser (64,66), and thus very high speed circuits may be driven by contact pads on the probe membrane and probed by a laser beam. Employing an optically transparent membrane (200) having test probe contacts (206,208) for bias, driving and loading a circuit under test, and having an electro-optic polymer layer (102, 202), a probing laser beam (204) may be directed through the membrane and the electro-optic polymer layer to sample an RF field generated by a device (214) under test. Measurement of internal circuit node voltage wave forms in the electro-optic substrate of a device (34, 50) under test may be accomplished by using test probe contacts (14, 55) to bias, drive and load the device under test while transmitting a laser probe beam (46, 76) through the membrane and electro-optic substrate.

19 Claims, 5 Drawing Sheets

OTHER PUBLICATIONS

"Characterization of Microwave Integrated Circuits Using an Optical Phase–Locking and Sampling System", H–L. A. Hung et al., 1991 IEEE MTT–S Digest, 1991, pp. 507–510.

"Comparison of Electro–Optic and Photoconductive Sampling Using a 28–Ghz Monolithic Amlifier", E. Chauchard et al., Picosecond Electronics and Optoelectronics, pp. 52–56.

"On–Wafer Testing of MMIC with Monolithically Integrated Photoconductive Switches", S. L. Huang et al., 1992 IEEE MTT–S Digest, 1992, pp. 661–664.

"Picosecond Optics and Microwave Technology", C. H. Lee, IEEE Transactions on Microwave Theory and Techniques, vol. 38, No. 5, May 1990, pp. 596–607.

"Generation of High–Power Broad–Band Microwave Pulses By Picosecond Optoelectronic Technique", H. A. Sayadian, IEEE Transactions on Microwave Theory and Techniques, vol. 37, No. 1, Jan. 1989, pp. 43–50.

"Electro–optic Probing of Integrated Circuits by Using Poled Polymers", T. Nagatsuma et al., abstract/summary, OSA Annual Meeting, TuBB2, Sep. 22, 1992, p. 79.

"Optimal Performance of an Electro–Optical Sampler", J. Lindemuth, SPIE vol. 793, Ultrafast Lasers Probe Phenomena in Bulk and Microstructure Semiconductors, 1987, pp. 120–124.

"An Automated Laser Prober to Determine VLSI Internal Node Logic States", F. J. Henley et al., 1984 International Test Conference, Paper 17.1, IEEE, 1984, pp. 536–542.

"Electro–optic Sampling Using Injection Lasers", J. M. Wiesenfeld, SPIE vol. 795, Characterization of Very High Speed Semiconductor Devices & Integrated Circuits, 1987, pp. 339–344.

"Measurement of On–Chip Waveforms and Pulse Propagation in Digital GaAs Integrated Circuits by Picosecond Electro–Optic Sampling", X. C. Zhang et al., Electron Letters, vol. 22, Jan. 1986, pp. 264–265.

"Gallium Arsenide Integrated Circuit Testing Using Electrooptic Sampling", K. J. Weingarten, Ultrafast Electronics Laboratory, Stanford University, Dec. 1987.

"Picosecond Optical Sampling of Gallium Arsenide GaAs Integrated Circuits", IEEE Journal of Quantum Mechanics, vol. 24, No. 2, pp. 198–220, Feb. 1988.

"Picosecond Backside Optical Detection of Internal Signals in Flip–Chip Mounted Silicon VLSI Circuits", H. K. Heinrich et al., Microelectronic Engineering, vol. 16, pp. 313–324, Elsevier 1992.

"Novel Approach To Miniature Conductive Sampling of Microwave Circuits", S. L. Huang et al., JFD2 Conference on Laser and Electro–Optics, Anaheim, CA, May 10–15, 1992.

"Organic Patch Sensor for Electro–Optic Measurement of Electrical Signals in Integrated Circuits", Electronics Letters, vol. 27, No. 11, pp. 932–934, May 1991.

"Ultrafast Opto–Electronics", pp. 183–233, W. Kaiser, Ultrashort Laser Pulses and Applications, Springer–Verlag, New York 1988.

"375–GHz–bandwidth photoconductive detector", Appl. Phys. Lett., vol. 59, No. 16, pp. 1984–1986, Oct. 1991.

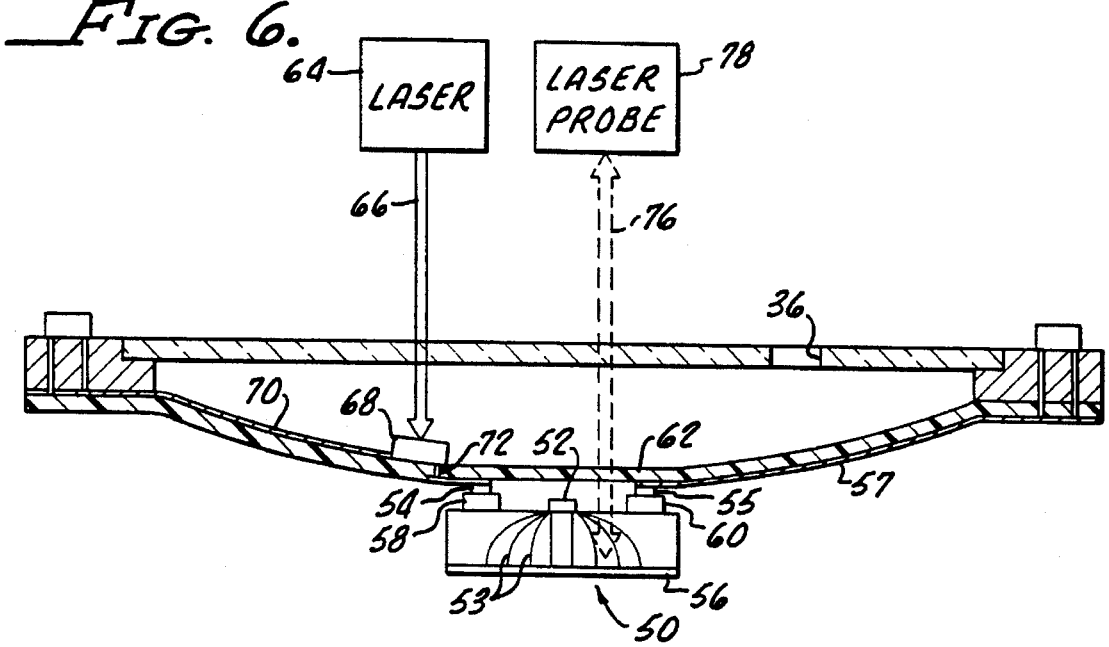
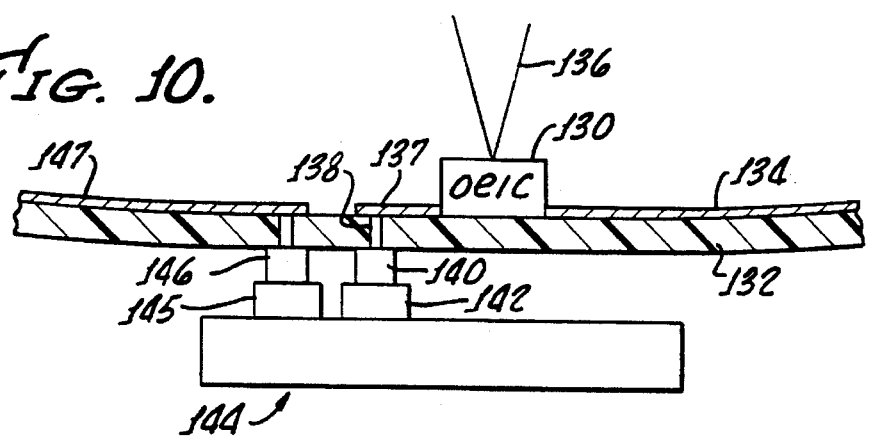
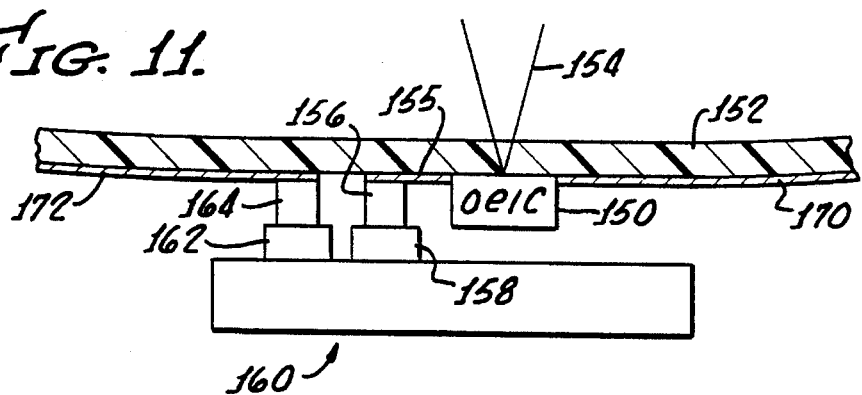

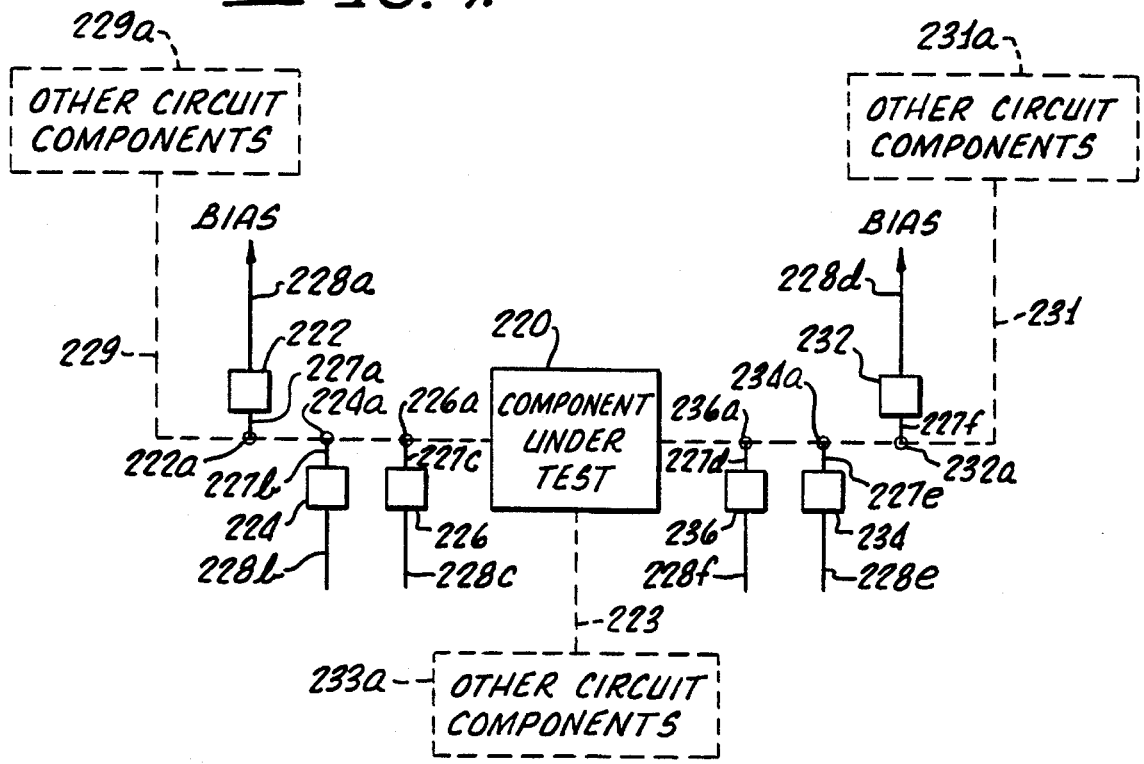
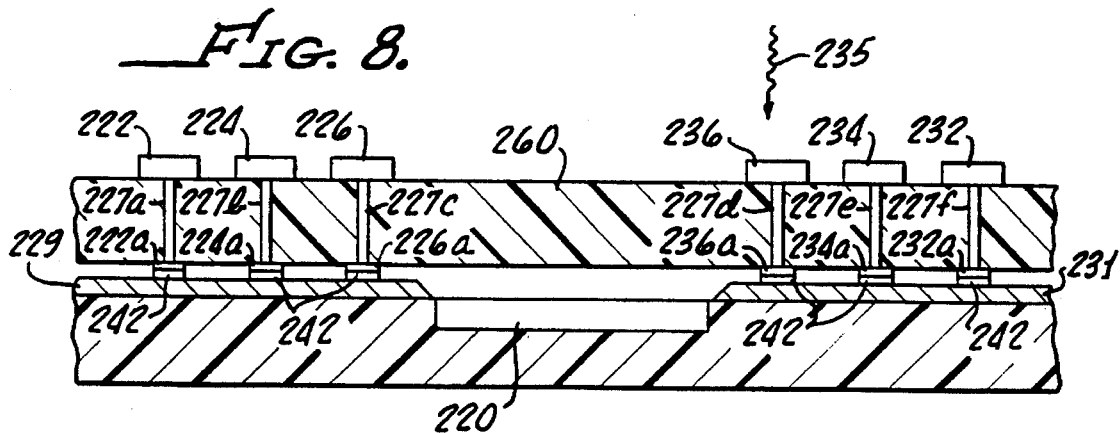

OPTO-ELECTRONIC MEMBRANE PROBE

BACKGROUND OF THE INVENTION

1. Field of the Invention

The present invention relates to testing of high speed circuits with minimized mechanical damage to the circuit's test pads. The invention more particularly concerns high throughput and high bandwidth testing of such high speed circuits by use of opto-electronic devices.

2. Description of Related Art

Integrated circuits, (ICs), and monolithic microwave or millimeter wave integrated circuits (MMICs) are manufactured with large numbers of identical circuits on a single wafer. Individual circuits are ultimately separately cut from the wafer for use as chips. It is desirable to test each circuit individually to determine whether or not it functions as intended before separating it from the wafer. Additional testing of separated circuits may be desired at various stages of the assembly of the circuit in the finished apparatus. Still further testing may be accomplished after mounting a circuit in a hybrid package, after placing a circuit in a multi-chip module, after disassembly of a multi-chip module to identify inoperable circuits, and even after the circuit's final packaging operation.

Conventional electromechanical testing employs either individual probe arms or a single probe card that is provided with a multitude (two or more) of small tungsten blades or needles that are mechanically and electrically connected to the circuit-under-test and act as test probe contacts. Electrical leads on the probe armor card extend from the contacts to the outer edge of the board for connecting the probe card to test circuitry. In use, the blades or needles are moved into engagement with the pads of an integrated circuit. The motion has to be such that there is a slight scrubbing action that is required for breaking through oxidation coating that often covers an aluminum pad. Thus, blades or needles are frequently positioned at an angle so that they will effectively slide along or scrub a surface of the pad to break the oxide coating. This provides an electrical connection so that signals can be read to determine integrity of the circuit on the chip.

Ends of the test needles or blades must all fall in the same plane in order to assure that each one makes electrical contact with a pad of the integrated circuit. This is accomplished by bending the blades or needles after they are mounted on the probe card, which is laborious, time consuming and expensive. Even after such adjustment, the blades or needles tend to creep back toward their original position so that their adjusted locations are lost. This loss of adjustment also comes about from the pressure of the needles against the chips, aggravated by the scrubbing action used to assure penetration of an oxide coating. As a result, constant maintenance is necessary or the probe cards will not perform their intended function. Even when in proper adjustment the needles cannot compensate for significant differences in the heights of the contact pads on the integrated circuit chips being tested. The close spacing necessary for testing some chips cannot be achieved with conventional needle contacts. The needles may also apply excessive force against the chip so as to damage the chip or its contact pads. This problem is greatly magnified by the fact that a single chip may require testing at different stages in its assembly into a finished module. In fact, some specifications will limit the number of times that a single chip can be tested in order to avoid excessive chip damage caused by the testing operation itself.

Improved testing arrangements are disclosed in a co-pending application Ser. No. 07/606,676, filed Oct. 31, 1991, now U.S. Pat. No. 5,148,103, by John Pasiecznik, Jr. for Method and Apparatus for Testing Integrated Circuits, and in a co-pending application Ser. No. 07/752,422, filed Aug. 30, 1991 by Blake F. Woith and William R. Crumly for Rigid Flex Circuits With Raised Features as IC Test Probes, now U.S. Pat. No. 5,264,787. Both of these applications are assigned to the same assignee as that of this application, and both are incorporated herein by reference as though fully set forth.

In the above-identified application of John Pasiecznik, Jr. a flexible membrane is provided with raised features on one side which connect through conductive circuit traces to a probe card that is in turn connected to the test circuitry. During use of the membrane probe for testing, probe pressure deflects the membrane to ensure that raised contacts formed on the membrane are pressed against the pads of an integrated circuit to provide an electrical connection. Electrical traces are also formed on the membrane to electrically connect the raised probe test contacts to test circuitry. The membrane probes of the above-identified co-pending applications may not operate satisfactorily at frequencies above about 20 GHz, at least in part because of the length and mutual proximity of conductive traces on the membrane required to electrically connect the membrane probe test contacts with external test signal generators. Accordingly, high frequency test signal generators operating at frequencies beyond 20 GHz cannot be employed when testing with a prior membrane probe. Moreover, there may be required such a large number of impedance-matched metallic conductive traces on the membrane itself as to significantly stiffen the membrane, which thus is unable to utilize or to obtain maximum advantage from the inherent membrane flexibility.

Membrane probes of the above-identified applications may encounter difficulty in optimizing membrane flexibility to obtain positive electrical contacts while avoiding drooping of the membrane center.

In the past, high frequency test signal generators and measurement instruments have required special types of high bandwidth test connections to a circuit under test. Some of such signal generators and measurement circuits have been mounted directly on the surface of a wafer bearing chips to be tested, but this consumes valuable surface area of the wafer and chip, and thus degrades efficiency and cost-effectiveness of production. Alternatively, extremely delicate, high frequency test equipment has been mechanically and electrically connected to the probe pads of a circuit using numerous individually-positioned microwave probe arms, rigid or semi-rigid microwave transmission lines, and other specialized connectors. Such connector mounting, fixturing, and positioning is highly laborious and greatly impedes production throughput.

Prior optical arrangements for testing high frequency circuits are unable to satisfactorily accomplish ultra high bandwidth excitation of the device under test or absolute voltage measurements at specified circuit nodes at high device throughput rates. Some of the prior test arrangements for electro-optic substrate probing have required the circuit to be biased up, driven and loaded with conventional test fixtures, such as those involving sharp needles or blades, which tend to damage the circuit's test pads, or wire bonds. These requirements have limited the prior test arrangements to very low-throughput applications.

Electro-optic substrate probing, such as shown by U.S. Pat. No. 4,681,449 to D. M. Bloom and B. H. Kolner, entitled High Speed Testing of Electronic Circuits by Electro-Optic Sampling, does not, by itself, accomplish high throughput, ultra high bandwidth testing. Furthermore, by itself, it fails to accomplish ultra high bandwidth optical excitation of the circuit-under-test; and it does not perform absolute voltage measurements at specified circuit nodes. Moreover, utilizing the arrangement described in Bloom and Kolner's patent, and the arrangements described by K. Weingarten, M. Rodwell, and D. Bloom in an article entitled "Picosecond Optical Sampling of Gallium Arsenide GaAs Integrated Circuits", in the IEEE Journal of Quantum Mechanics, Volume 24, No. 2, Pages 198–220, February 1988, requires conventional test fixtures, such as rigid blades or needles which may damage the circuit's test pads or wire bonds. Another disadvantage of prior-art electro-optic substrate probing is that wafer thickness variations can result in widely varying optical reflectivities from micro-strip ground planes due to Fabry-Perot or optical standing wave interference effects in a thinned wafer, especially for circuit locales having no passivation layers on their top surfaces. This problem is especially troublesome in topside electro-optic substrate probing of microstrip circuit geometries, which employs the optical reflectivity of certain planes in the substrate, particularly when sampling pulse lengths are comparable to or longer than the thicknesses of the thinned wafers (50–100 micrometers typical).

In an article entitled "Picosecond Backside Optical Detection of Internal Signals in Flip-Chip Mounted Silicon VLSI Circuits", H. K. Heinrich, N. Pakdaman, J. L. Prince, D. S. Kent, and L. M. Cropp published in *Microelectronic Engineering*, volume 16, pages 313–324, Elsevier, 1992, there is described a method for interferometrically sensing spot-to-spot variations in free charge densities in an integrated circuit fabricated on a semiconductor material. From these charge density variations, high-bandwidth currents and voltage waveforms can be inferred. This technique, like that in Bloom and Kolner's patent, requires conventional test fixtures which will slow down the test through put and which may damage the circuit.

In an article entitled "Novel Approach To Miniature Conductive Sampling Of Microwave Circuits", S. L. Huang, L. P. Golob, C. H. Lee and H. A. Hung, published in the JFD2 Conference on Laser and Electro-Optics, Anaheim, Calif. May 10–15, 1992, there is described on-wafer photoconductive measurements of the S-parameters of a 60 GHz monolithic microwave integrated circuit (MMIC) low noise amplifier by integrating six very closely spaced photoconductive gaps at the input and output of a 60 GHz MMIC chip. This arrangement requires fabrication of photoconductive gaps directly on the chip itself, thereby adding complexity to chip design, decreasing chip yield and complicating its fabrication. Other workers have described a method to electro-optically measure the S-parameters of an electrical device by using standard, destructive electrical connections to launch the electrical output of this device into a separate 50% transmission line fabricated on a rigid piece of electro-optic material. The connection requirements of this arrangement prohibit its use in high-throughput test applications.

Accordingly, it is an object of the present invention to provide for the testing of circuits, including very high frequency circuit devices, by apparatus and methods that eliminate or avoid the above-mentioned problems.

SUMMARY OF THE INVENTION

In carrying out principles of the present invention in accordance with a preferred embodiment thereof, a test probe includes a flexible membrane having probe test contacts and conductive traces that transmit electrical signals to and from the probe test contacts for transmission to test pads of a device under test. The membrane also mounts an optically-driven test signal generator, which itself is connected to at least one of the test probe contacts. The test signal generator mounted on the membrane may be any one of a number of different optically-addressable or optically responsive devices or circuits capable of generating high speed test signals. The membrane simultaneously mounts a diverse range of optical and electrical components and devices which are used to accommodate high bandwidth, non-destructive probing of the circuit-under test.

According to one of the disclosed embodiments, the membrane and its contacts are employed to bias up, drive and load down a circuit under test that has an electro-optic substrate. A probing laser beam is passed through a transparent window of the membrane and through the electro-optic substrate to be reflected therefrom so as to enable measurement of internal circuit node voltage wave forms at selected internal circuit nodes of the device under test.

According to another embodiment, the membrane carries an electro-optic layer held in close proximity to the circuit features of interest, so that fringing field lines from the circuit modulate the birefringence of the electro-optic layer. According to another embodiment, the membrane carries an electro-optic polymer layer, a co-planar transmission line, and raised metallic bumps for mechanically contacting electrical pads of the circuit under test. Such contact to specified circuit pads will launch an electromagnetic wave along the transmission line. The fringing field lines of this wave will modulate the birefringence of the electro-optic polymer. Electro-optically sampling the voltage amplitudes and phases as a function of position and mathematical analysis of the data obtained therefrom leads to an accurate measurement of the device's S-parameters.

Separate features of the described embodiments can also be combined.

BRIEF DESCRIPTION OF THE DRAWINGS

In the accompanying drawings:

FIG. 6 illustrates a photo-conductively driven membrane probe for testing a device having an electro-optic substrate;

FIG. 7 illustrates the circuit of an arrangement of six-gap photoconductor devices used for S-parameter measurement of an MMIC chip;

FIG. 8 is a side elevational view of a test probe embodying the circuit of FIG. 7;

FIG. 10 is a side sectional view of a photoconductor/optical electronic membrane probe having an opto-electronic integrated circuit on an upper surface;

FIG. 11 shows a side sectional view of a membrane probe having an opto-electronic integrated circuit on a bottom surface.

DESCRIPTION OF THE PREFERRED EMBODIMENTS

Figure 1:
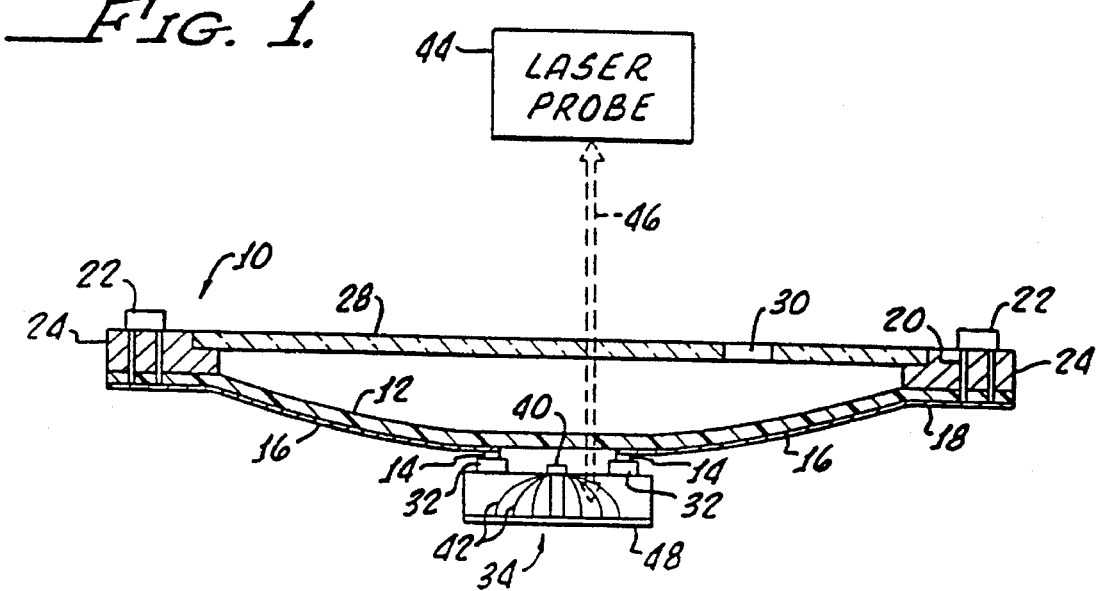
FIG. 1 is a sectional view of a membrane probe employed for optical probing of an IC chip having a substrate made of a material having electro-optical effect.

Illustrated in FIG. 1 are portions of a membrane probe card that are fundamentally the same as those described in the above identified co-pending applications of John Pasiecznik, Jr. and Blake F. Woith and William R. Crumly. A rigid annular substrate 10 is formed of a suitable dielectric material, such as a photo-ceramic material, a polyimide or a phenolic resin. Secured to the substrate 10, as by an adhesive or other suitable means, is a thin, flexible transparent membrane 12, upon the lower surface of which (as viewed in the drawings) has been formed a plurality of probe test contacts 14 that are electrically connected with conductors 16 (see FIGS. 1 and 2) formed on the side of the membrane that bears the contacts 14. The conductors each individually extend from one probe contact radially outwardly to a peripheral portion 18 of the membrane, where the individual conductors are connected by means of vias 20 extending through the substrate 10 to contact elements 22 on the other side of the substrate 10. One or more flats 24 on the periphery of substrate 10 enable orientation of the probe in holding fixtures (not shown).

The probe card is arranged to be secured to a probe test fixture (not shown) that provides signal connections from test fixture circuitry to the individual probe contacts 14 via the conductors 16, vias 20 and contact pads 22. The probe card may be secured to a test fixture by means and in the manner described in the above-identified co-pending applications. When mounted in the test fixture the probe contacts will electrically connect to pads of a chip to be tested for transmission of signals to and from the chip pads. A thin, rigid, transparent plate 28, having a hole 30 therein, is also mounted on the rigid annular substrate 10 and allows visual observation of the test probe contacts 14 to enable alignment of the test probe contacts 14 with the chip contact pads 32 mounted on a chip 34. In the embodiment illustrated in FIG. 1 the chip to be tested includes a substrate of a material having an electro-optic effect, such as gallium arsenide (GaAs) or indium phosphide (InP). In this arrangement the chip includes an RF signal line 40 that produces electromagnetic radio frequency field lines, generally indicated at 42.

The electro-optic material and chip substrate used is one of a group of devices and materials that may be referred to herein as an optically-addressable device. The term "optically-addressable" is used herein to refer to devices (e.g. photo-conductive switches) and materials (electro-optic materials) that either respond electrically to an optical signal (e.g. by generating a corresponding electrical signal) or somehow measurably alter the properties of an incident optical beam.

Electrical test circuitry (not shown) connects to contact pads 22 on the surface of the probe substrate and sends (or receives) electrical signals to (or from) probe test contacts 14 which will electrically bias up, drive and load down the integrated circuit chip 34 that is being tested.

In the arrangement of FIG. 1 internal circuit node voltage wave forms of the substrate of chip 34 (which is being tested) are encoded onto the high bandwidth probe laser beam by the linear electro-optic effect. Laser probe apparatus 44 extracts the internal node voltage waveforms from the polarization modulated laser beam. Laser probe apparatus 44 transmits a polarized laser beam 46 through the membrane probe fixture into the substrate of the test chip 34, where it is reflected from an optically reflective metallic ground plane 48 on the bottom of the chip, back through the chip, through the probe membrane 12, through the glass 28 and back to the laser probe apparatus 44. Either the entire membrane is transparent or it is formed with a transparent window having a pre-determined position relative to the membrane, or relative to the substrate of the device to be tested. Such a window is provided at a selected area of the membrane for passing the laser beam. The window is formed by routing traces and other opaque elements on the membrane around the window. The RF field 42 is generated by the driving of the circuit via the electrical contacts 14. As is well known, the RF field 42 in the electro-optic substrate modulates the polarization of the probe laser beam 46. A polarizing beam splitter inside the laser probe beam apparatus 44 converts the polarization modulation of the returned beam into an intensity modulation, and this intensity modulation is detected with circuitry in the laser probe apparatus 44 by means well known in the art. For example, U.S. Pat. No. 4,681,449 to Bloom et al. describes one arrangement for electro-optic sampling of a circuit chip. The above-mentioned article by Weingarten, Rodwell and Bloom also describes and explains an implementation of electro-optic sampling wherein a lock-in amplifier and a synchronous sampling signal processing system are used to detect intensity modulation.

Figure 2:
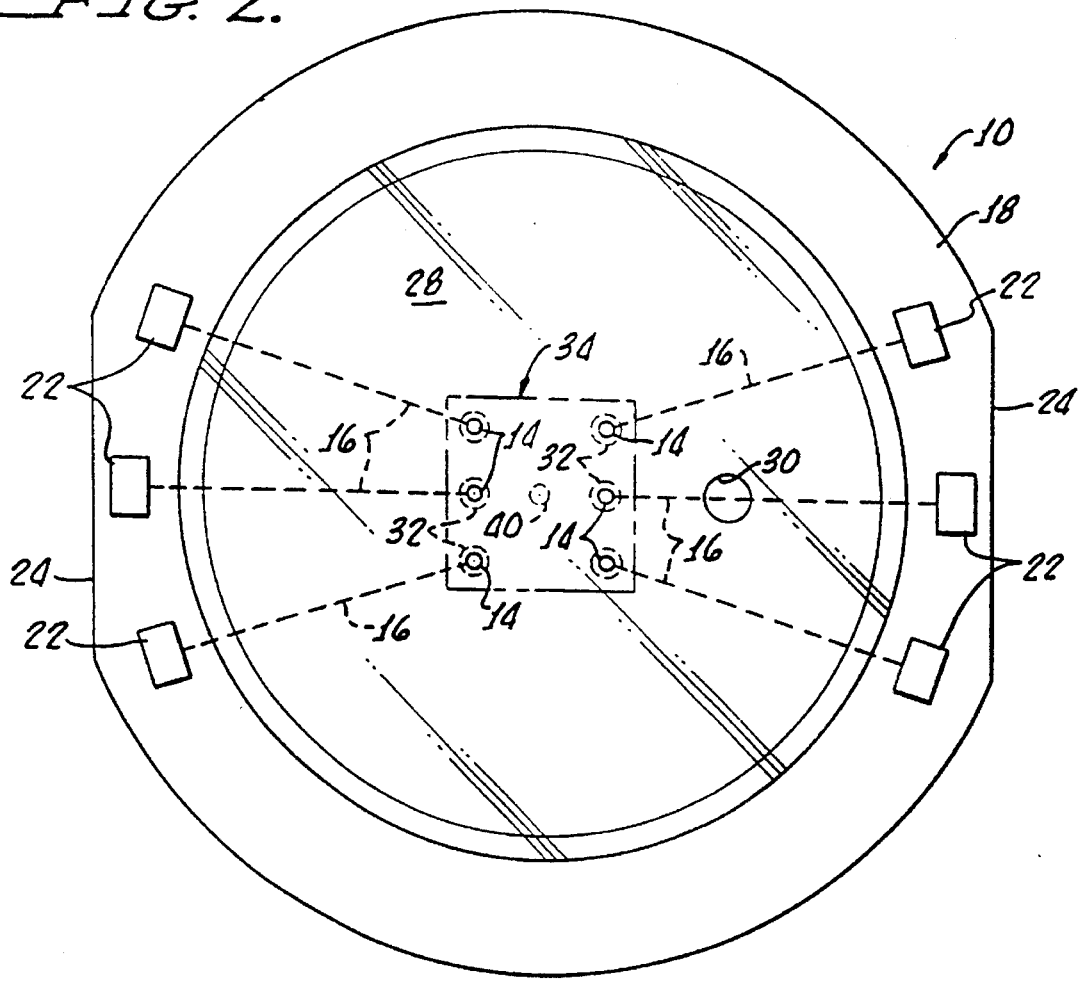
FIG. 2 is a top plan view of the probe of FIG. 1.

In the arrangement illustrated in FIGS. 1 and 2, the flexible membrane probe is employed to electrically bias up, load and drive the opto-electric substrate chip 34 (via direct contact between chip pads 32 and probe contacts 14) with the above-described advantages of a soft, gentle touchdown and the like on the IC chip test pads, with minimum damage. At the same time very high frequency optical measurement of internal circuit node voltage wave forms is accomplished.

Figure 3:
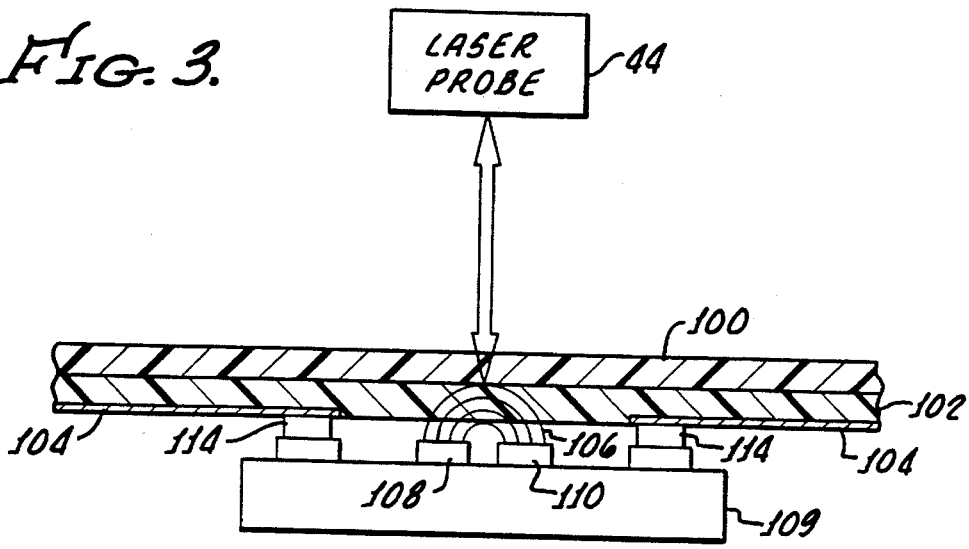
FIG. 3 illustrates parts of an electro-optic membrane probe showing how fringing field lines from a monolithic microwave integrated circuit extend into a polymer layer.

FIG. 3 illustrates a central portion of a membrane probe substantially the same as the probe of FIGS. 1 and 2, but having its membrane modified for high-throughput electro-optic testing of circuits fabricated on either opaque substrates or on substrate materials having no linear electro-optic effect, or co-planar circuits fabricated on any kind of material. In this figure, laminated to the polyimide membrane 100 is an electro-optic polymer layer 102 such as that described by Nagatsuma, Yaita, Shinagawa, Amano, and Shuto in an article entitled "Organic Patch Sensor for Electro-Optic Measurement of Electrical Signals in Integrated Circuits," in *Electronics Letters*, Volume 27, No. 11, Pages 932–934, May 1991. Electric field lines 106 emanating from the co-planar lines 108,110 of the circuit-under-test 109 pass through the electro-optic polymer layer as shown, modulating its index of refraction via the linear electro-optic effect. The modulated polarization is detected and analyzed by the laser probe apparatus 44. Also laminated onto the flexible supporting membrane 100 are a plurality of electrically conductive traces which carry to the probe's test pads 114 all the electrical signals required to bias-up, drive, and load-down the circuit under its normal test conditions.

Figure 4:
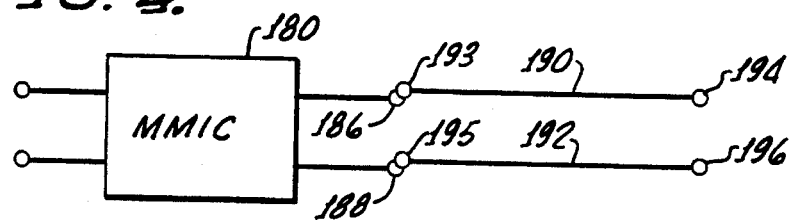
FIG. 4 shows a circuit arrangement for using an electro-optic membrane probe to measure S-parameters of a monolithic microwave integrated circuit.
Figure 5:
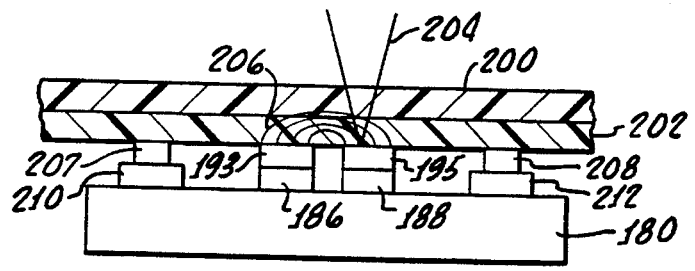
FIG. 5 is a side sectional view of transmission line geometry of parts of a membrane test probe for electro-optic sampling of the circuit of FIG. 4.

FIG. 4 schematically shows a top view of the circuit of an embodiment for making high-bandwidth high throughput measurements of the S-parameters of high speed circuits or devices. Probe structure for making measurements indicated in FIG. 4 is shown in FIG. 5. In this arrangement, high frequency transmission lines 190,192 are laminated onto an electro-optic polymer layer 202 of a test probe membrane 200. Ends 193 and 195 of lines 190,192 are gently contacted to test pads 186 and 188 (FIG. 4) formed on the circuit-under-test 180 while opposite ends 194,196 are appropriately terminated. The voltage and phase of the electrical wave form in the high frequency transmission line 190,192 is measured as a function of position along this transmission line, and the S-parameter of the device is calculated by fitting the acquired data to the four S-parameter equations, as described in the above-cited article by K. Weingarten, M. Rodwell, and D. Bloom entitled "Picosecond Optical Sampling of Gallium Arsenide GaAs Integrated Circuits" and in the thesis of Weingarten. The advantage of the embodiment illustrated in FIGS. 4 and 5 is that the circuit-under-test can readily be attached to an off-circuit transmission line, whereas in the prior art the transmission line was required to be either laboriously wire-bonded to the circuit, or built-in to the circuit on the wafer level. In the arrangement illustrated in FIGS. 4 and 5, no wafer real estate is consumed by the transmission line (e.g. transmission line 190,192) test structure, and the potentially damaging electro-mechanical contacts associated with blades or needles of conventional probes or wire bonding are not required between the circuit-under-test and its associated transmission line test structure. In the arrangement of FIG. 4 other transmission line geometries are possible.

FIG. 5 is a side view of the arrangement of FIG. 4, for the above-described optical measurements of device S-parameters. This figure shows a section of a flexible transparent supporting membrane 200 forming part of a test probe. To the underside of the supporting membrane is laminated an electro-optic polymer layer 202 that is optically responsive to a probing laser beam 204. Transmission lines 190,192 extend in a direction perpendicular to the plane of the paper (FIG. 5) and conduct the RF electromagnetic field indicated by RF lines 206, which produce an electro-optic effect in polymer layer 202 which modulates the probing laser beam 204. In FIG. 5 only ends 193,195 of the transmission lines 190,192 are seen. The flexible membrane probe has a number of additional test probe contacts to bias-up and drive the circuit-under-test, some of which are shown at 207,208 in FIG. 5, which are arranged to contact pads 210,212 on the MMIC chip 180 that is being tested. The chip also includes contact pads 186,188 which are arranged to connect to the ends 193,195 of the membrane-mounted transmission lines 190,192 when the membrane test probe is pressed down against the chip to be tested. As previously mentioned, these transmission lines are schematically shown in the circuit of FIG. 4, but are actually formed directly on and carried by the underside of layer 202 which, in turn, is affixed to the flexible probe membrane 200. The probing laser beam 204 is directed through the transparent flexible membrane 200 (or through a window in the membrane) and through the transparent electro-optic polymer layer 202 at selected points along the length of the transmission line to provide desired electro-optic sampling of the signals generated by circuits on chip 180, while it is driven, as a function of position along the transmission line 190,192.

Illustrated in FIG. 6 are portions of an electro-optic membrane probe substantially the same as that shown in FIGS. 1 and 2 but modified by the addition of an optically-addressable test signal generator that is mounted directly on the membrane. Thus, in FIG. 6, testing is to be performed on an MMIC chip 50, having a substrate of electro-optic material and including an RF signal line 52 which generates RF electro-magnetic field lines 53. The chip includes a reflective ground plane 56 on its bottom surface and chip contact pads such as pads 58,60 on its upper surface. The test probe includes a flexible transparent membrane 62 (or a membrane having a transparent window) including probe test contacts 54, 55 on its lower surface. Some of the probe test contacts, such as contact 55 are connected to electrically conductive traces, such as that indicated at 57. In this case the probe test contacts, including probe test contact 55 and others (not shown) are employed to bias and load the chip by contact with chip pads such as pad 60 and others (not shown). However, in the arrangement of FIG. 6 the chip circuit is driven optically by laser exciting circuitry 64 that generates an exciting laser beam 66 directed at a high frequency photoconductive (e.g. optically-addressable) switch 68 that is mounted on an upper surface of the membrane 62. The photoconductive switch is a small body of material that responds to a received optical signal by generating an electrical signal. The photoconductive device 68 may be powered by dc bias circuitry, not shown, through an electrically conductive trace 70 formed on the upper surface of the membrane. The photoconductive device is connected to probe test contact 54 by means of a via 72 extending through the membrane into electrical contact with probe test contact 54. Thus, the MMIC (monolithic microwave integrated circuit chip or monolithic millimeter-wave integrated circuit chip) 50 is electrically biased and loaded by the probe contacts. It is optically driven by the exciting laser beam 66 and the optically driven test signal generator formed by photoconductive switch 68. Accordingly, the MMIC chip 50 generates electromagnetic field lines 53 in the chip substrate that may be optically probed by the probing polarized laser beam 76 generated by and transmitted from a laser probe circuit 78. Probing laser beam 76 passes through the transparent flexible probe membrane, (or through a window in the membrane), through substrate material of the chip where it is polarization modulated by the electro-optic effect of gallium arsenide or other electro-optic substrate and retro-reflected from chip ground plane 56, back through the membrane to the laser probe apparatus 78, as previously described. The membrane and its probe test contacts are employed to electrically bias up and load down the circuit under test by direct electrical connection to test circuitry. The circuit is driven optically (at a suitable very high frequency) by the exciting laser beam 66 and the photoconductive signal generator 68 while the electro-optic substrate of chip 50 is used to modulate the probing laser beam 76 for measuring internal circuit node voltage wave forms.

The described electro-optic membrane probe may also be employed for measurements of S-parameters of a MMIC monolithic microwave integrated circuit in the manner described in the above-mentioned article by S. L. Huang, et al. entitled "Novel Approach To Miniature Photoconductive Sampling Of Microwave Circuits". This "six gap" photoconductive method is schematically illustrated in FIG. 7, which shows a 60 GHz MMIC chip 220 connected (by means of the membrane probe, as shown in FIG. 8) via a group of three photoconductive switches 222, 224 and 226 between bias leads 228a, 228b, 228c on one side of the chip circuit. The other side of the chip circuit is connected (by means of the membrane probe) to bias leads 228d, 228e. 228f by means of three photoconductive switches 232, 234 and 236. Membrane contacts 222a,224a,226a,232a,234a, 236a (which are on the probe membrane as shown in FIG. 8) are connected to photoconductive switches 222, 224, 226,

232, 234, 236 by electrically conductive vias 227a–f. Dotted lines, 229, 231, 233 in FIG. 7 represent electrical connections between the MMIC 220 and other circuits or circuit components 229a, 231a, 233a. Each of the photoconductive switches is basically a photoconductive gap comprising two closely adjacent but mutually spaced ends of two conductors, with the gap between the ends containing a photoconductive material. In the absence of an incoming light beam no signal is transmitted across the gap, whereas when it is optically excited, the photoconductive material between the gaps conducts to effectively close the switch across the gap. Photoconductive switches of this type can be made with a wide range of materials and using a number of different geometries, such as described by D. Auston in "Ultrafast Opto-electronics," pp. 183–233 of W. Kaiser's book entitled *Ultrashort Laser Pulses and Applications,* Springer-Verlag, New York, 1988; by Chen et al. in an article entitled "375-*GHz-bandwidth photoconductive detector,*" in Appl. Phys. Lett., Vol. 59, No. 16, pp. 1984–1986, October 1991; and by others. Each of the photoconductive devices or gaps is individually excited by precisely synchronized laser pulses, such as laser pulse 235 (FIG. 8), for example, with the several devices being excited at different times to enable the measurement to be made as described by the article of Huang, et al. In the use of this six gap photoconductive method for measuring S-parameters, the several gaps need not be located directly on the wafer, as in prior art, with all the inherent disadvantages thereof as described in the Huang, et al. article. To the contrary, according to one feature of the present invention, the several photoconductive gaps are directly mounted on a surface (either upper or lower) of the test probe membrane. This is shown in FIGS. 7 and 8. Device 220 to be tested includes a plurality of contact pads, such as pads 242 (FIG. 8), which are arranged to be contacted by test probe conductive contacts, 222a, 224a, 226a, 232a, 234a, 236a. The latter are mounted on a polyimide membrane 260 of the membrane test probe which has conductive traces on an upper surface thereof. Each of the test probe contacts 222a through 236a is connected by means of one of vias 227a–f through the flexible membrane 260 to photoconductive gaps or switches 222, 224, 226, 232, 234, 236 on the upper surface of the transparent membrane, which in turn are connected to the electrically conductive bias and signal traces, 228a–f, on the membrane. Photoconductive gaps 222–236 may be mounted on either the upper surface of the membrane 260, as shown in FIG. 8 or on the lower surface of the membrane, thereby eliminating the need for the vias.

In the circuit shown in FIG. 7, the chip under test 220, includes contact pads such as pads 242 (FIG. 8) on conductive metallization lines 231. Thus a signal may flow, for example, from the first photoconductive switch 222 on the polyimide membrane, thence to the second photoconductive switch 224 on the polyimide membrane, thence to the third photoconductive switch 226 on the polyimide membrane, thence through the device under test 220, thence to photoconductive switch 236, thence to photoconductive switch 234, thence to photoconductive switch 232, and thence into other circuit components 231a. Electrical reflections of the same signal from the device under test 220 can be sampled by photoconductive switches 226 and 224. An electrical signal generated by one or more of these switches then is transmitted through one of the vias extending through the polyimide membrane to one of the probe contacts 222a–236a that makes contact with a pad 242 on the device under test. Similarly, a signal flows to and between the photoconductive switches 236, 234, 232 on the upper surface of the membrane, and the electrical signals generated thereby are conducted through the vias, to membrane contacts 232a–236a to contact pads 242 of the circuit-under-test. Additional electrical signals for biasing or loading may be provided to the circuit under test and/or to the other circuit components 229a, 231a and 233a, by means of electrically conductive traces (not shown) on the surface of the membrane and thence, via additional test probe contacts (not shown) to contact pads of the circuit-under-test. In this arrangement the impulse transfer function of the device is measured photoconductively, as described by Huang, et al., and the S-parameter of the device is calculated from acquired data. This technique enables measurement of the S-parameters of the device over a wider range of frequencies than is possible using conventional network analyzers, as described by Huang, et al. Further, since all of the photoconductive signal generators in the arrangement of FIGS. 7 and 8 are located on the membrane rather than on the chip itself, the chip is easier and less expensive to fabricate.

Electrical signals generated at photoconductive switch 232 may flow in the opposite direction to photoconductive switches 234 and 236, backwards through the device under test 220, thence to photoconductive switches 226 and 224, and so on. Since the measurements are made on the device under test 220 in situ (that is while it is electrically connected to the other circuit components 229a, 231a, 233a on the chip) realistic determinations of the device's S-parameters under its normal operating conditions are possible, as described by Huang, et al.

Figure 9A:
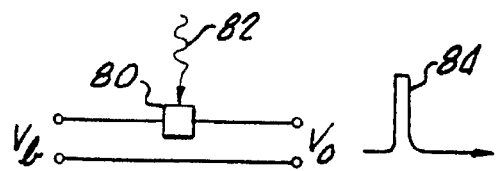
FIGS. 9a–e illustrate several different optically driven high speed function generators that may be mounted directly upon a membrane probe.

The embodiments of FIGS. 6–8 show optically driven test signal generators in the form of simple photoconductive switches. Nevertheless, it will be readily understood that many other types of optically driven electrical function test signal generators may be employed in the hybrid membrane/optical testing arrangements described above. Several examples of such optically-driven signal generators and samplers, as described in the book chapter of D. Auston, cited above, are illustrated in FIGS. 9a–9e and may include those required for the S-parameter measurements described above in connection with FIGS. 7 and 8. In FIG. 9a, a test signal pulse 84 is generated by a circuit employing a photoconductive device 80, which is excited optically by a beam 82 and has an input voltage $V_b$ that generates an output voltage $V_o$ in the form of the pulse 84. This circuit including device 80, may be mounted directly to the membrane of the probes described herein to photoelectrically generate the test pulse 84.

Figure 9B:
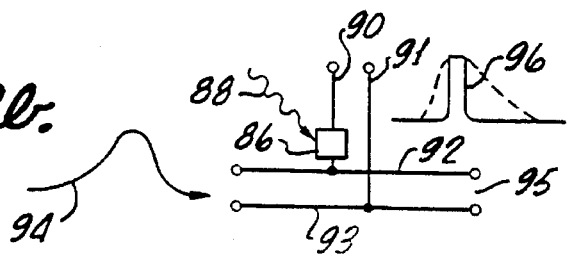

FIG. 9b shows a photoconductive device 86 optically excited by a laser beam 88 and having electrical inputs on lines 90, 91 to gated lines 92, 93. The latter receive an input wave form 94 to produce an output at terminals 95 in the form of a gated pulse 96. This figure shows the circuit of a sampling gate (such as photoconductive switches 222–236) identified in FIGS. 7 and 8.

Figure 9C:
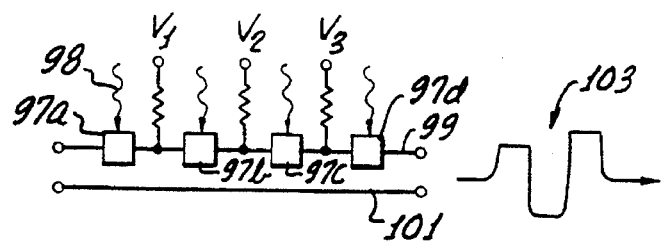

A frozen wave generator circuit, as shown in FIG. 9c, may employ a plurality of photoconductive devices 97a, 97b, 97c and 97d, each individually excited by a laser beam, such as laser beam 98, with input voltages labelled $V_1$, $V_2$ and $V_3$ resistively coupled to a conductor that connects the several photoconductive devices in series. At output terminals, on lines 99 and 101, appears a frozen wave in a form such as that illustrated at 103. These photo conductive devices may be mounted on a test probe membrane with output terminals 99, 101 connected to probe test contacts for soft and gentle contact with contact pads of a device to be tested.

Figure 9D:
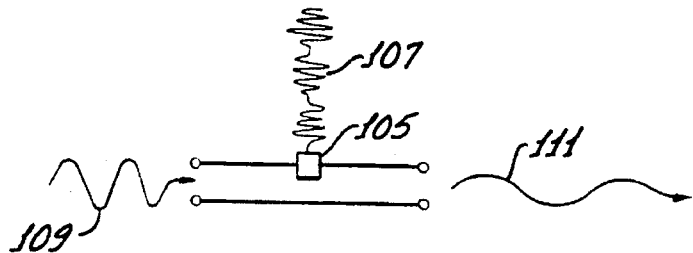

FIG. 9d shows an RF mixer formed by a photoconductive device 105 that receives a modulated exciting laser beam 106 and also receives a high frequency input signal 109 to produce a combined output signal 111 having a frequency proportional to the difference between the two frequencies input to the photoconductive device.

Figure 9E:
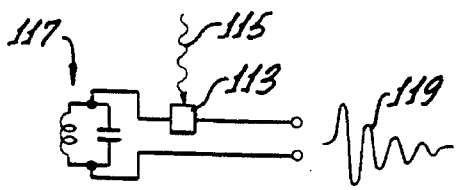

In FIG. 9e is illustrated an RF burst generator employing a photoconductive device 113 excited by a laser beam 115 and connected to a resonant circuit 117 at one side to produce a rapidly decaying burst oscillation signal 119 at its output.

Any one of the circuits illustrated in FIGS. 9a–9e, among others, may be formed directly on either the upper or lower surface of the membrane of the test probes described herein to produce one of the optically driven test signals, as may be deemed necessary or desirable. Alternatively, such circuits may be embodied in an integrated circuit chip mounted on the membrane and arranged to be optically excited, as indicated in the several drawings.

FIG. 10 illustrates the arrangement of a hybrid membrane probe in which a photoconductive device or other more complex optically-driven test signal generator such as an integrated optical receiver or any of the devices illustrated in FIGS. 9a–e is generically labeled as an opto-electronic integrated circuit (OEIC), indicated at 130 in FIG. 10. The OEIC 130 is mounted on the upper surface of a flexible test probe membrane 132. One example of such an opto-electronic integrated receiver is a high bandwidth photoconductor integrated to a high bandwidth amplifier to form an optical receiver. The membrane has electrically conductive traces 134 formed on an upper surface thereof for connection of the opto-electronic integrated circuit 130 to bias and/or drive circuitry, or to a suitable transmission line for RF signals. The opto-electronic circuit 130 is optically excited by a probe laser beam 136 and has an electrical output connected by means of a conductive trace 137 and a via 138 through the membrane 132 to a probe test contact 140, which in turn connects with a contact pad 142 of a circuit or chip 144 that is to be tested. Chip 144 has additional contact pads, such as, for example, pad 145, which connect to other probe test contacts, such as contact 146, which are connected by means of a via to a ground connection 147 on the test probe membrane. Again in this circuit the device under test 144 is biased and loaded electrically by means of the soft and gentle contact of the test probe contacts and is effectively optically driven by the opto-electronic integrated circuit chip 130 and probe laser beam 136 by means of the via 138 and test probe contact pad 140 that is connected to the output of the opto-electronic integrated circuit chip.

Illustrated in FIG. 11 is a modification of the arrangement of FIG. 10 that operates in substantially the same manner. However, in this arrangement the optically driven OEIC test signal generator 150 is mounted on the under surface of the flexible test probe membrane 152 and driven by an exciting laser beam 154 that passes through the transparent membrane or a window in the membrane. The electrical test signal produced by the opto-electronic test signal generator 150 is coupled by a trace 155 to a membrane test contact 156 which is adapted to contact a pad 158 on a circuit under test, indicated at 160. Circuit 160 includes additional contact pads, such as that illustrated at 162, which make connection to additional test probe contacts 164 formed on the underside of test membrane 166. The opto-electronic integrated circuit chip 150 and other contacts on the test probe are electrically connected to external circuitry by means of electrically conductive traces, such as traces 170 and 172 formed on the under surface of the membrane 166.

Figure 12:
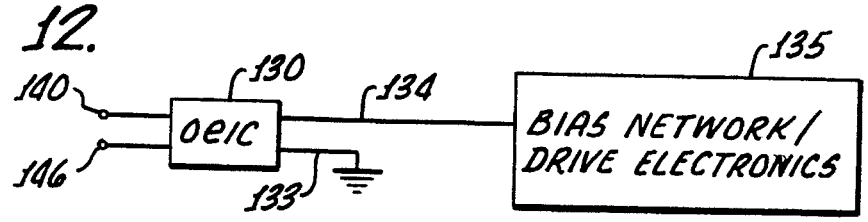
FIG. 12 illustrates a circuit of a photoconductive/opto-electronic membrane probe of the type shown in FIGS. 10 and 11.

FIG. 12 (sheet 2) shows a circuit of the arrangement of the optically driven test signal generator 130 of FIG. 10, showing lines 133, 134 connected between the OEIC 130, ground and a bias network and/or drive electronic circuitry 135. Output terminals of the OEIC that are connected to test probe contacts are shown at 140, 146.

All of the membrane test probes described herein are basically the same, having a flexible, transparent membrane, many probe contacts and mounted in a rigid frame, differing only as specifically described in connection with the several embodiments.

In all of the embodiments illustrated in FIGS. 1 through 12 a high frequency electrical signal is either generated, controlled, or sampled by an optical beam. The high frequency content of the optical beam can be obtained by using either a short pulse mode locked laser, a high frequency modulated laser, such as those involving gain switching, or from the heterodyning of two separate lasers which have their frequencies offset by a fixed amount.

There have been described a number of different arrangements of employing optical probing or optical excitation of very high speed circuits which arrangements are combined with the use of a flexible membrane test probe that provides soft, gentle and precision contact with devices under test. Optically driven test signal generators are directly mounted on the flexible test probe membrane. The latter is also configured to provide electrical connections to the device under test for bias, loading and other arrangements. Test signals may be employed having high frequency arbitrarily complex wave forms, including RF bursts and other more complex wave forms. These test signal generators are integrated to and mounted directly upon the flexible membrane of the test probe. The arrangements preserve the high bandwidth and absolute, direct and relatively noninvasive measurements that are advantageous with such circuits. Further, the structures described herein enable the testing of very high frequency circuits, operating well above 20 GHz.

With optically driven test signal generators mounted directly on the membrane, inputs to the test signal generators are provided optically rather than by transmission lines or by electrically conductive traces formed directly on the membrane. Thus, the membrane does not require integration of as many high frequency transmission lines on the membrane itself and is less susceptible to pickup or cross talk problems associated with high densities of closely packed high frequency transmission lines. Importantly, by reducing the number of metallic transmission lines on the flexible membrane, the rigidity of the membrane is reduced, because each of the metallic transmission lines decreases membrane flexibility. The test circuits, including the photoconductive nodes, may be optically addressed either by bulk optics or optical fibers or by laser beams, and thus will not stiffen the membrane to the same degree as metallic transmission lines.

What is claimed is:

1. A test probe for testing high speed circuits of an integrated circuit chip comprising:

a flexible membrane having an outer surface, a plurality of test probe contacts on said surface configured and arranged to contact pads of a device to be tested, said test probe contacts including a first group of contacts configured and arranged to provide power, bias and loading to circuits of said chip, a plurality of conductive traces on said membrane connected to respective ones of said test probe contacts and configured and arranged for connection to test circuitry, and an optically-addressable device mounted to said membrane, wherein the optically-addressable device is comprised of an electro-optic polymer layer laminated to the flexible membrane, said contacts and traces being formed on said electro-optic layer, and wherein some of the conductive traces on said membrane are transmission lines laminated onto the electro-optic polymer layer of the membrane and have ends adapted to be contacted to pads of the device under test, said transmission lines being configured and arranged to sustain an electrical standing wave when two ends of said transmission lines are contacted to pads of a device-under-test.

2. The test probe of claim 1 wherein said optically-addressable device comprises means on said membrane responsive to an optical signal for generating an electrical signal.

3. The test probe of claim 1 wherein said optically-addressable device comprises electro-optic material that modulates an optical signal in the presence of a radio frequency signal therein.

4. The test probe of claim 1 for testing a device under test having an electro-optic substrate, wherein the optically-addressable device includes a transparent window in the flexible membrane having a predetermined position relative to the substrate of the device-under-test for passing an optical signal to said substrate.

5. The test probe of claim 1 for testing a device under test having a semi-conductor substrate, and wherein the optically-addressable device includes a transparent window in the flexible membrane having a predetermined position relative to the substrate of the device-under-test for passing an optical signal to said substrate.

6. The test probe of claim 1 wherein the electro-optic polymer layer is laminated onto the outer surface of the flexible membrane such that the electro-optic polymer layer can be held in very close proximity to selected co-planar features of interest on the device-under-test.

7. The test probe of claim 1 wherein said optically-addressable device is a high frequency photoconductive switch mounted on said membrane.

8. The test probe of claim 7 wherein said high frequency photoconductive switch is configured to be an electrical pulse generator.

9. The test probe of claim 7 wherein said high frequency photoconductive switch is configured to be a sampling gate.

10. The test probe of claim 7 wherein said high frequency photoconductive switch is configured to be a frozen wave generator.

11. The test probe of claim 7 wherein said high frequency photoconductive switch is configured to be an RF mixer.

12. The test probe of claim 7 wherein said high frequency photoconductive switch is configured to be an RF burst generator.

13. The test probe of claim 7 wherein said high frequency photoconductive switch is integrated to signal processing circuitry to form an opto-electronic integrated circuit.

14. The test probe of claim 13 wherein said opto-electronic integrated circuit is a high-bandwidth photoconductor integrated to a high bandwidth amplifier to form an optical receiver.

15. The test probe of claim 1 including means for directing a laser beam at said optically-addressable device, and means for directing a polarized laser beam through said membrane to said device-under-test.

16. The test probe of claim 1 wherein said optically-addressable device comprises a plurality of high frequency photoconductive switches mounted on said membrane configured in a six-gap arrangement for making measurements of the S-parameters of a component of the device-under-test.

17. A test probe for testing high speed circuits of an integrated circuit chip having an electro-optic substrate and including an RF signal line that produces electromagnetic radio frequency field lines in the substrate, the substrate having a reflective ground plane on a lower surface, said test probe comprising:

a flexible transparent membrane having an outer surface, a plurality of test probe contacts on said surface configured and arranged to contact pads of a circuit to be tested and to provide power, bias and loading for said circuit, a plurality of conductive traces on said membrane connected to respective ones of said test probe contacts and configured and arranged for connection to test circuitry, means for transmitting a polarized laser beam through said transparent membrane and through said field lines in the substrate for reflection from said ground plane, the laser beam being modulated during transmission through the substrate, and means for sensing the modulation to test said circuit.

18. The test probe of claim 17 including an optically addressable switch on said membrane, and a laser for activating said switch, said switch being connected to some of said test probe contacts for driving said circuits at very high frequency in response to said laser.

19. A test probe for testing a high speed circuit of an integrated circuit chip comprising:

a flexible membrane having an outer surface, an electro-optic layer laminated to said outer surface, a plurality of test probe contacts on said electro-optic layer outer surface configured and arranged to contact pads of a device to be tested and to provide power, bias and loading for said high speed circuit, a plurality of conductive traces on said electro-optic layer outer surface connected to respective ones of said test probe contacts and configured and arranged for connection to test circuitry, a high frequency transmission line on said electro-optic layer outer surface having a pair of said test probe contacts at one end for contacting pads of said integrated circuit chip, said transmission line on said electro-optic layer outer surface having circuit node voltage wave forms generated by test signals applied via said test probe contacts, and means for directing a laser probe beam at said electro-optic layer adjacent the transmission line.

* * * * *